United States Patent
Mitra et al.

(10) Patent No.: US 7,335,955 B2
(45) Date of Patent: Feb. 26, 2008

(54) ESD PROTECTION FOR PASSIVE INTEGRATED DEVICES

(75) Inventors: Agni Mitra, Gilbert, AZ (US); Darrell G. Hill, Tempe, AZ (US); Karthik Rajagopalan, Chandler, AZ (US); Adolfo C. Reyes, Tempe, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 106 days.

(21) Appl. No.: 11/300,710

(22) Filed: Dec. 14, 2005

(65) Prior Publication Data

US 2007/0132029 A1    Jun. 14, 2007

(51) Int. Cl.
    *H01L 23/62* (2006.01)
(52) U.S. Cl. .............. 257/355; 257/379; 257/528; 438/210
(58) Field of Classification Search .......... 257/355
See application file for complete search history.

(56) References Cited

U.S. PATENT DOCUMENTS

| | | |
|---|---|---|
| 2005/0024800 A1 | 2/2005 | Zecri et al. |
| 2005/0047036 A1 | 3/2005 | Liu et al. |
| 2005/0236672 A1 | 10/2005 | Kodama et al. |
| 2005/0242400 A1 | 11/2005 | Cheng et al. |
| 2005/0247980 A1 | 11/2005 | Yach et al. |
| 2005/0250263 A1 | 11/2005 | Liu et al. |
| 2005/0254189 A1 | 11/2005 | Wu et al. |
| 2006/0002048 A1* | 1/2006 | Cheung et al. ............ 361/118 |

* cited by examiner

*Primary Examiner*—Tu-Tu Ho
(74) *Attorney, Agent, or Firm*—Ingrassia, Fisher & Lorenz, P.C.

(57) ABSTRACT

Methods and apparatus are provided for ESD protection of integrated passive devices (IPDs). The apparatus comprises one or more IPDs having terminals or other elements potentially exposed to ESD transients coupled by charge leakage resistances having resistance values much larger than the ordinary impedance of the IPDs at the operating frequency of interest. When the IPD is built on a semi-insulating substrate, various elements of the IPD are coupled to the substrate by spaced-apart connections so that the substrate itself provides the high value resistances coupling the elements, but this is not essential. When applied to an IPD RF coupler, the ESD tolerance increased by over 70%. The invented arrangement can also be applied to active devices and integrated circuits and to IPDs with conductive or insulating substrates.

13 Claims, 6 Drawing Sheets

ESD PROTECTION FOR PASSIVE INTEGRATED DEVICES

TECHNICAL FIELD

The present invention generally relates to protection of electronic devices against damage from electrostatic discharge (ESD), and more particularly relates to ESD protection of integrated passive devices.

BACKGROUND

Modern electronic devices are susceptible to damage from transient electrostatic discharge, commonly referred to as "ESD." ESD events often occur when a person whose body has accumulated a static charge, touches or handles the electronic device. Static charge build-up can occur from a person walking across a carpeted surface or as a result of motion of certain types of clothing or from other sources. In any case, when the electronic device is touched by a charged person or other object, the built-up charge can be suddenly discharged through the electronic device. This can result in catastrophic damage to the electronic device. Accordingly, many electronic devices include some type of internal ESD protection. This often takes the form of an auxiliary transistor or Zener diode or other non-linear semiconductor device placed between one or more of the input/output (I/O) terminals of the electronic element being protected and a reference potential or common connection. This protective device detects the sudden rise in terminal voltage produced by the ESD event and switches on or otherwise creates a relatively low impedance path to the reference connection, thereby shunting the ESD current harmlessly to ground. Such ESD protection arrangements take many forms well known in the art. They have in common the above-noted feature that they normally present comparatively high impedance to the circuit they are protecting so as not interfere with its normal operation but are triggered into activity by the rising ESD pulse. As the leading edge of the ESD pulse is sensed, they switch to a low impedance state thereby limiting the voltage rise produced by the ESD pulse, in effect, clipping the top off the ESD pulse. When the ESD transient has passed, they once-again revert to a high impedance state. While such prior at arrangements work well in connection with active devices and integrated circuits, they are generally not applicable to integrated passive components where the necessary non-linear semiconductor devices or other type of non-linear spark-arrestors are not available. Accordingly there continues to be a need for means and method for protecting integrated passive devices. As used herein, the word "integrated" is intended to include elements formed in or on a common substrate. Thin film conductors and dielectrics are commonly used in integrated passive devices.

Accordingly, it is desirable to provide an improved means and method for ESD protection of electronic devices, especially for integrated passive devices. In addition, it is desirable that the means and method for providing such protection be generally compatible with available fabrication methods for such electronic devices so as to not require substantial changes in the manufacturing process. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
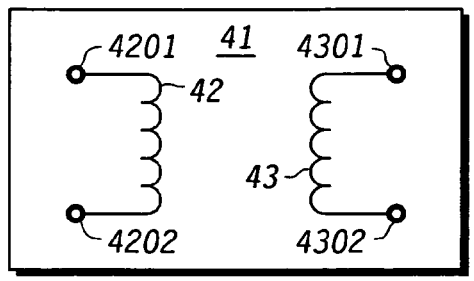
FIG. 1 is a simplified schematic circuit of an integrated passive coupler, according to the prior art.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

FIG. 1 is a simplified schematic circuit of integrated passive coupler (IPC) 40, according to the prior art. Integrated passive coupler 40 comprises magnetically coupled coils 42, 43 having terminals 4201, 4202 and 4301, 4302 respectively, all mounted on substrate 41. IPC 40 is generally formed using thin films that are deposited by various methods well known in the art on substrate 41. When formed by thin film technology, coils 42, 43 generally have a spiral shape in plan view but other shapes are not precluded. Substrate 41 is conveniently an insulating or semi-insulating substrate. The distance between coils 42, 43 is exaggerated in FIGS. 1-2 to facilitate better understanding.

Figure 2:
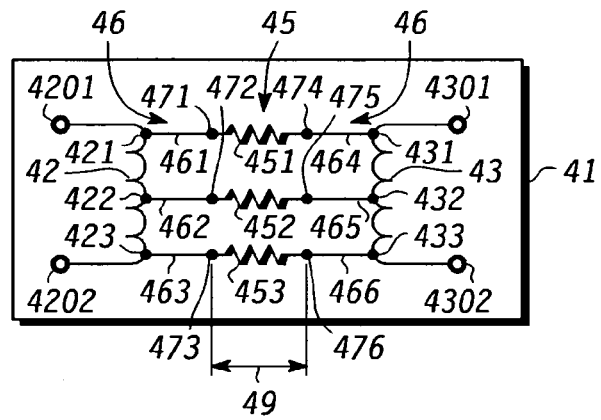
FIG. 2 is a simplified schematic circuit of an integrated passive coupler, according an embodiment of the present invention.

FIG. 2 is a simplified schematic circuit of integrated passive coupler (IPC) 44, according to an embodiment of the present invention. Like reference numbers are used to identify like elements in FIGS. 1 and 2. Integrated passive coupler 44 comprises magnetically coupled coils 42, 43 having terminals 4201, 4202 and 4301, 4302 respectively, all mounted on substrate 41. IPC 44 is generally formed using thin films that are deposited by various methods well known in the art on substrate 41. Coils 42, 43 can be substantially the same as those in IPC 40 except for the extra connections provided by the embodiment of the present invention. It has been found that the ESD tolerance of passive elements such as coupler 44 can be substantially improved without adversely affecting the ordinary performance of coupler 44 by providing one or more high resistance leakage paths 45 electrically coupling the windings of coils 42, 43. Advantage is taken of the fact that substrate 41 is a semi-insulating material, that is, generally having a resistivity usefully greater than about 1E3 ohms-cm, conveniently between 1E3 and 1E10 ohms-cm. and preferably between 1E7 and 1E9 ohms-cm. Un-doped GaAs or other III-V compounds are examples of suitable semi-insulating materials useful for substrate 41, but this is merely by way of example and not intended to be limiting. A wide variety of other materials well known in the art can also be used.

High resistance leakage paths are desirably created by coupling various windings of coils 42, 43 to substrate 41 via spaced-apart leads or conductors 46. Thus, conductors 461, 462, 463 couple portions 421, 422, 423 respectively of coil 42 to locations 471, 472, 473 on substrate 41 and conductors 464, 465, 466 couple portions 431, 432, 433 respectively of coil 43 to locations 474, 475, 476 on substrate 41. Locations 471, 472, 473 and locations 474, 475, 476 are spaced apart, for example, by distance 49 (individual distances may be varied) so that resistances 451, 452, 453 respectively (collectively 45) are formed between such connections. Depending upon the resistivity of substrate 41, distances 49 are chosen so that the resulting resistances 45 are usefully of the order of at least about 1E6 Ohms, conveniently at least about 1E8 Ohms and preferably about 1E9 Ohms. Larger or smaller values can be also be used. What is important is that resistances 45 be sufficiently high so as to not significantly degrade the performance of coupler 44 at the frequencies of interest and sufficiently low so as to inhibit the build-up of static charge between coils 42, 43. It has been found that resistances 45 in the range of about 1E6 to 1E11 Ohms are useful, with resistance of about 1E8 to 1E11 Ohms being convenient and resistances of about 1E8 to 5E10 Ohms being preferred. Stated another way, resistances 45 are usefully in the range of at least 100 times the operating impedance of coupler 44 at the frequencies of interest, conveniently at least a 500 times the operating impedance of coupler 44 at the frequencies of interest and preferably at least 1000 times the operating impedance of coupler 44 at the frequencies of interest. However, larger or smaller ratios can also be used depending upon the performance requirements of coupler 44. While coils 42, 43 are shown in FIG. 2 as being coupled via three resistances 451, 452, 453 connected to different locations on coils 42, 43, this is merely by way of example and not intended to be limiting. The present invention only requires that there be at least one relatively high value resistance coupling those portions of passive element 40 across which an ESD voltage can appear. Depending upon the physical size of the element being protected and its operating impedance, multiple spaced-apart high resistance paths can be provided or a distributed high resistance path can be provided. Either arrangement is useful. Persons of skill in the art will understand based on the description herein how to choose the most effective locations and size of the high resistance paths useful for improving the ESD performance of their particular IPD.

Figure 3:
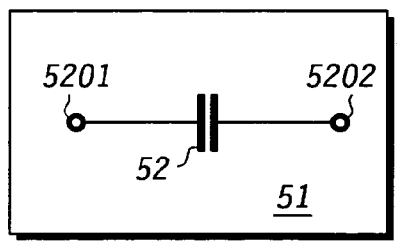
FIG. 3 is a simplified schematic circuit of an integrated passive capacitor, according to the prior art.

FIG. 3 is a simplified schematic circuit of integrated passive coupler 50 according to the prior art, comprising capacitor 52 with terminals 5301, 5202, formed on insulating or semi-insulating substrate 51. IPC 50 is conveniently formed using thin film techniques. For example, thin metal films separated by a deposited dielectric are used to form capacitor 52 and its associated terminals.

Figure 4:
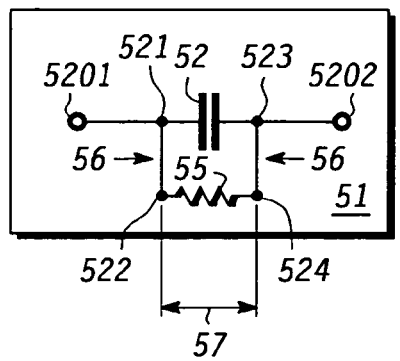
FIG. 4 is a simplified schematic circuit of an integrated passive capacitor, according a further embodiment of the present invention.

FIG. 4 is a simplified schematic circuit of integrated passive coupler (IPC) 54 analogous to coupler 50, but according a further embodiment of the present invention. Coupler 54 comprises capacitor 52 with terminals 5201, 5202 disposed on substrate 51 analogous to substrate 41 of FIG. 2. Advantage is taken of semi-insulating substrate 51 by providing conductors 56 coupling terminals 521, 523 on opposite sides of capacitor 52 to spaced-apart locations 522, 524 respectively on substrate 51. Locations 522, 524 are spaced apart by distance 57, providing comparatively high value resistance 55 therebetween. Resistance 55 should be sufficiently high so as to not interfere with the normal operation of capacitor 52 at the frequencies of interest and still low enough to provide improved bleed off of excessive charge, thereby improving the ESD performance of IPC 54. The same considerations apply in choosing the resistivity of substrate 51 and distance 57 as described in connection with IPC 44 of FIG. 2 and the discussion thereof is incorporated herein by reference. Substantially the same ranges of resistivity and resistance apply.

Figure 5:
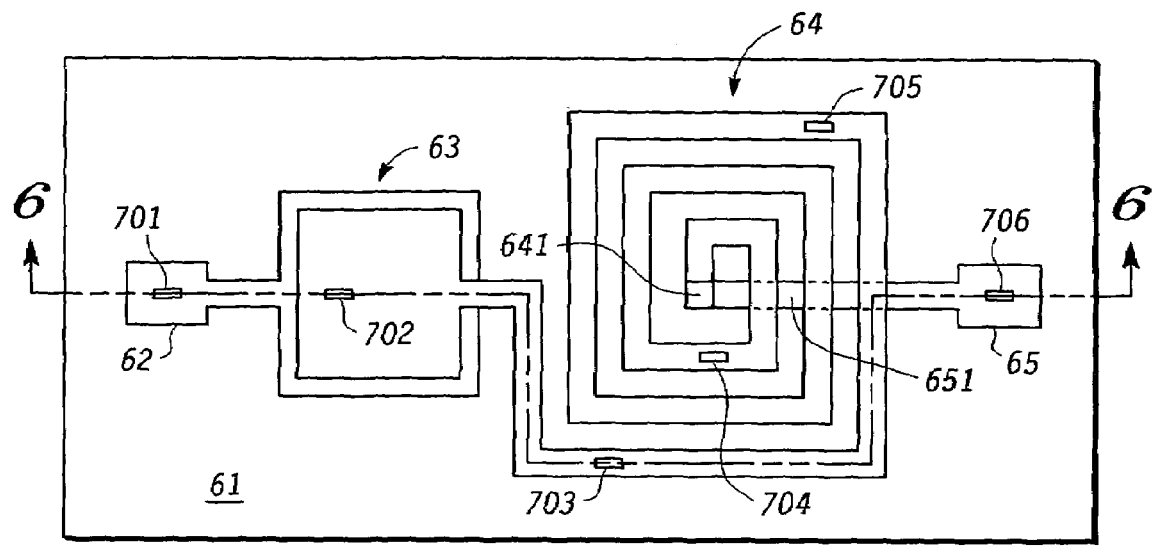
FIG. 5 is a simplified plan view of an integrated passive device (IPD) RF coupler according to another embodiment of the present invention.
Figure 6:
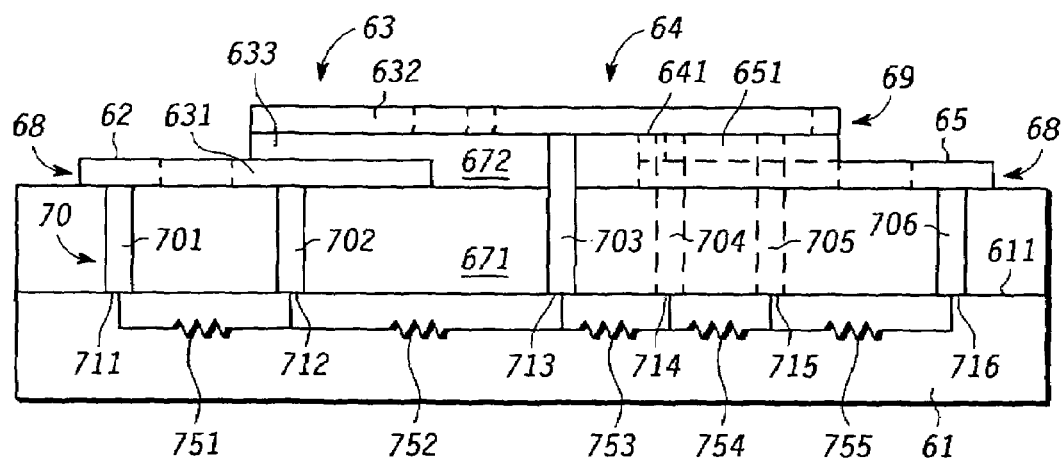
FIG. 6 is a simplified partial cross-sectional view through the IPD RF coupler of FIG. 5.
Figure 7:
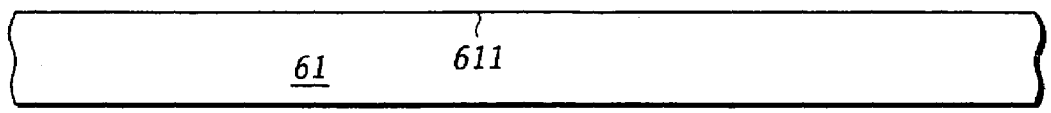
FIGS. 7-16 are sequential cross-sectional views illustrating a method of fabrication of an integrated passive device according to a still further embodiment of the present invention.
Figure 8:
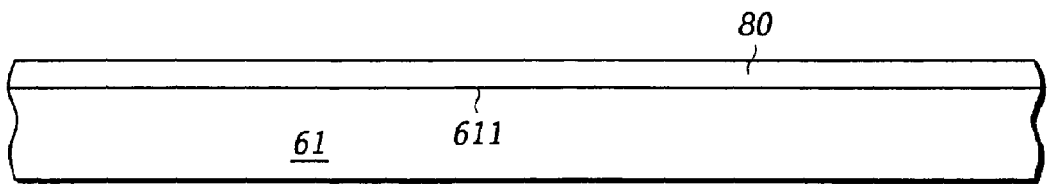
Figure 9:
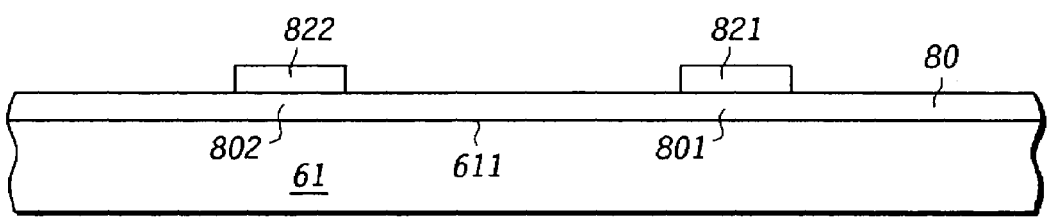
Figure 10:
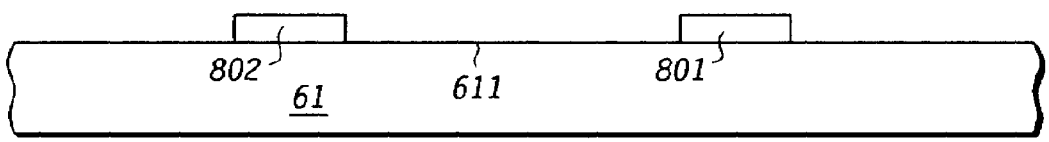
Figure 11:
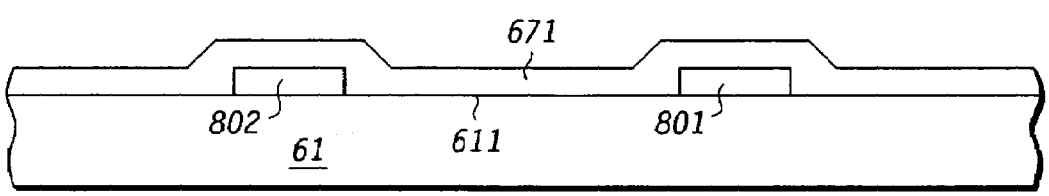
Figure 12:
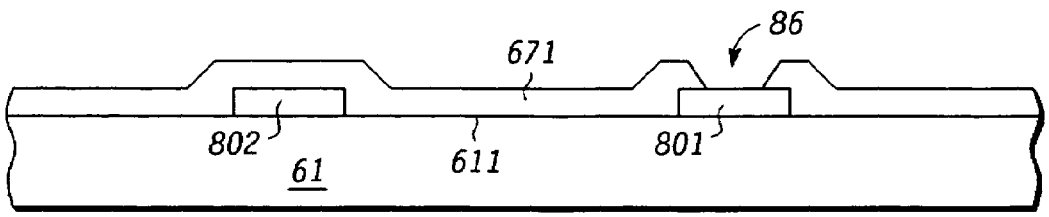

FIG. 5 is a simplified plan view and FIG. 6 is a partial cross-sectional view of integrated passive device (IPD) RF coupler 60 according to another embodiment of the present invention. Integrated passive coupler (IPC) 60 comprises insulating or semi-insulating substrate 61 analogous to substrates 41, 51 of FIGS. 2 and 4 on which are formed, e.g., by thin or thick film techniques, serially coupled first connection terminal or bonding pad 62, capacitor 63, inductor 64 and second connection terminal or bonding pad 65. Persons of skill in the art will understand based on the description herein that the choice and arrangement of elements 62-65 is merely by way of example and not intended to be limiting and that any number of passive (and/or active) elements could be included on substrate 61, coupled in various series-parallel combinations. The present invention is applicable to such further arrangements and is not limited merely to the particular examples shown herein, which are provided merely for convenience of description and not by way of limitation. Referring now to FIGS. 5 and 6 together, first dielectric layer 671 overlies upper surface 611 of substrate 61. First metal layer 68, supported by first dielectric layer 671, is conveniently used to form first bonding terminal 62 and lower plate 631 of capacitor 63 and to form second bonding terminal 65 including portion 651 extending underneath central portion 641 of inductor 64, to make electrical connection thereto. Second dielectric layer 672 is provided over portions of first dielectric layer 671 and first metal layer 68. Second dielectric layer 672 provides dielectric 633 in capacitor 63 and supports second metal layer 69 comprising upper plate 632 of capacitor 63 and spiral shaped inductor 64. A portion of metal layer 69 at location 641 in the center of inductor 64 conveniently (but not essentially) makes contact to portion 651 of first metal layer 68 so as to couple inductor 64 to terminal connection pad 65. This arrangement is by way of example and not intended to be limiting. As will be understood by persons of skill in the art, elements 63-65 can be coupled in any number of ways using either of metal layers 68, 69 or further metal layers. Leads 701-706 (collectively 70) are provided extending between metal layers 68, 69 and spaced-apart locations 711-716 on substrate 61. Leads 701, 702, 706 extend from first metal layer 68 to substrate 61 and Leads 703, 704, 705 extend from second metal layer 69 to substrate 61. When substrate 61 is a semi-insulating material, analogous to substrates 41, 51 of FIGS. 2 and 4, then resistances 751-755 tying together the various metal regions of elements 62-65 are created by the combination of leads 70 and substrate 61. When substrate 61 is semi-insulating as discussed in connection with FIGS. 2 and 4, then resistance 751-755 can be arranged to have the appropriate values by adjusting their number and spacing and the resistivity of substrate 61. In that situation, then leads 70 should be comparatively conductive that is, generally 1E3 to 1E10 times more conductive than substrate 61 since they are not being relied on to provide the high value resistance for charge bleed off, but this is not essential.

The present invention works even when substrate 61 is insulating or of relatively high conductivity, that is, not a semi-insulating material. When substrate 61 is an insulating material and cannot be relied on to provide the charge bleed-off resistance, then a high resistivity film is deposited on surface 611 of substrate 61 (e.g., see FIGS. 17-25) underneath first dielectric layer 671, and leads 701, . . . , 706 make contact to such high resistivity film, which then provides resistances 751-755. If substrate 61 is too highly conductive to provide the desired high value resistances 751-755, then the roles of down-leads 701-706 and substrate 61 can reversed. That is, leads 701-706 can be formed from high resistivity material leading to comparatively conductive substrate 61, thereby provided the high resistance values desired so as to not compromise the ordinary operation of coupler 60 at the frequency ranges of interest. Un-doped or lightly doped semiconductors are suitable materials for leads 701-706 with this configuration, i.e., with high resistance down-leads going to a comparatively conductive substrate. Alternatively, the surface of substrate 61 can be converted or coated with an insulatinglayer and the high resistivity film formed thereon. Either approach is useful.

Figure 13:
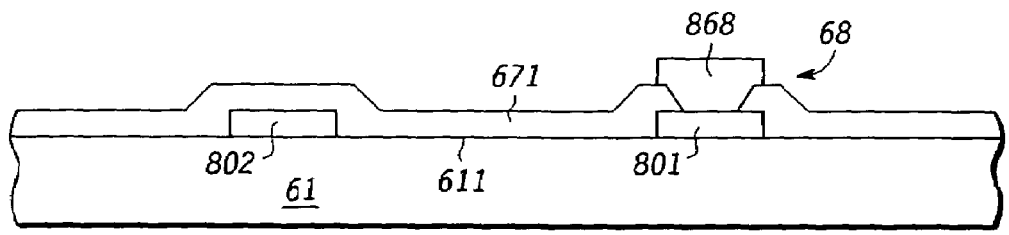
Figure 14:
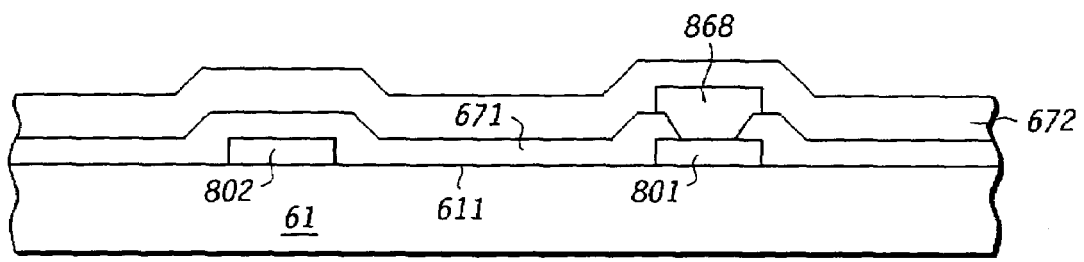
Figure 15:
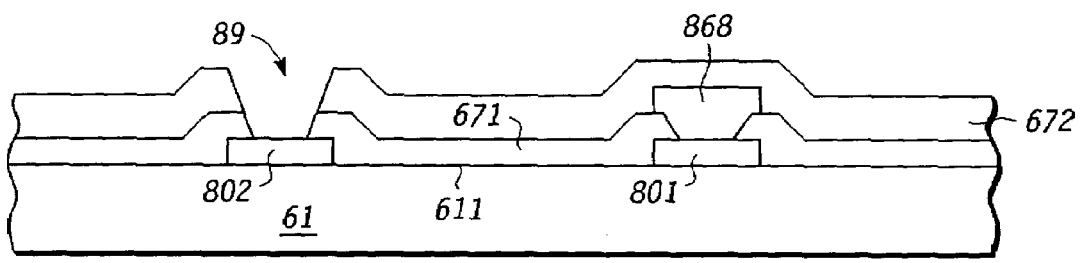
Figure 16:
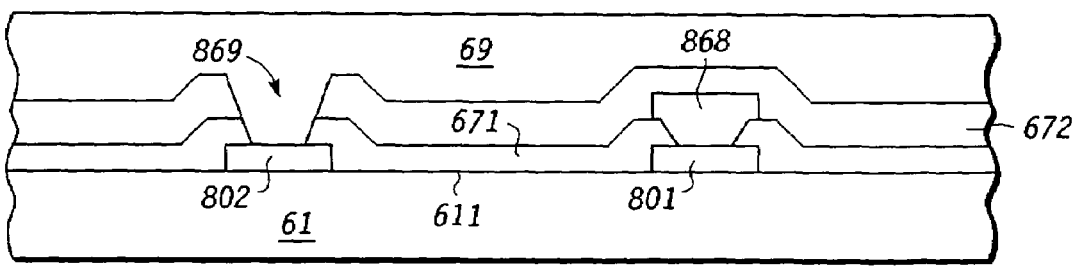
Figure 17:
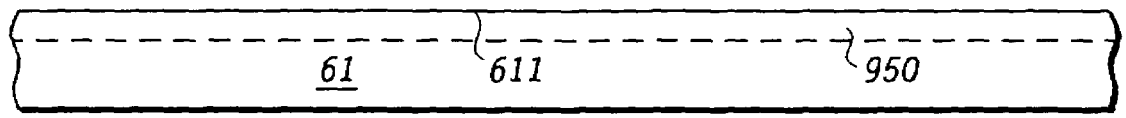
FIGS. 17-24 are sequential partial cross-sectional views illustrating steps in a method of fabrication of an integrated passive device according to a yet further embodiment of the present invention.
Figure 18:
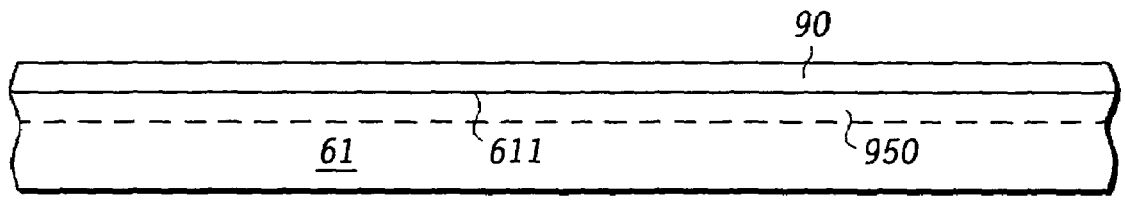
Figure 19:
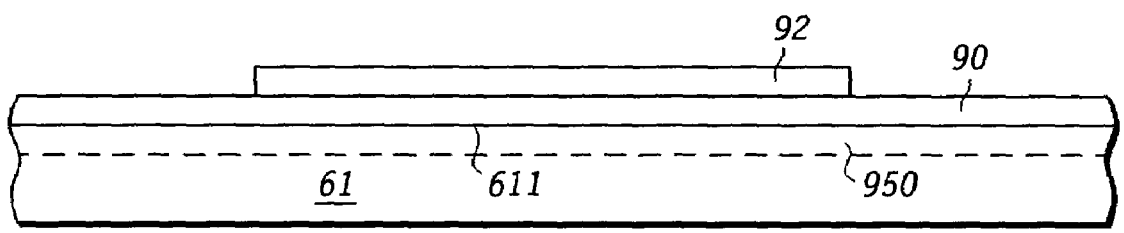
Figure 20:
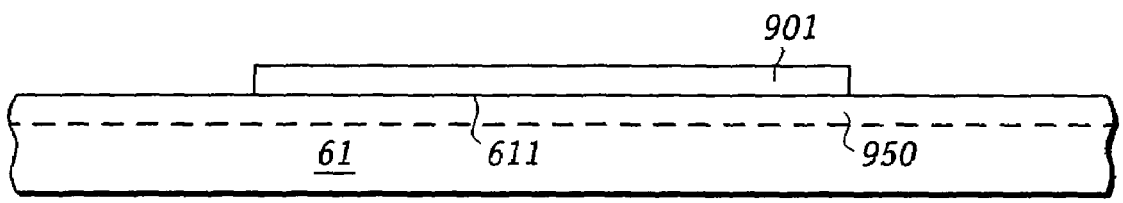

FIGS. 7-16 are sequential partial cross-sectional views 401-410 illustrating a method of fabrication of an integrated passive device, analogous to device 60 of FIG. 6, according to a still further embodiment of the present invention. In FIGS. 7-16, the manufacturing sequence useful for forming the multiple layers needed to fabricate device 60 and provide down-leads 701-706 (collectively 70) are emphasized. The further masking steps needed to laterally define terminal connection pads 61, 65, capacitor 63 and inductor 64 will be understood by those of skill in the art and are omitted so that the process for forming down-leads 70 may be more easily understood. In step 401 of FIG. 7, substrate 61 of, e.g., GaAs, and having upper surface 611 is provided. In step 602 of FIG. 8, conductor layer 80 of, for example, TiWN or other materials that can provide electrical contact to substrate 61 and of thickness in the range of usefully, at least 0.1K Angstrom units, conveniently 0.1K to 8K Angstrom units and preferably 2K to 4K Angstrom units is deposited. Chemical vapor deposition (CVD), plasma enhanced chemical vapor deposition (PECVD), evaporation, sputtering and/ or various combinations thereof are useful. Sputtering is preferred. In step 403 of FIG. 9, masking layer 82 (e.g., of photo-resist) is applied and patterned to provide mask portions 821, 822 over conductor regions 801, 802 respectively where down-leads 70 are desired to contact surface 611 of substrate 61. In step 404 of FIG. 10, those portions of conductor 80 lying outside of masks 821, 822 are etched away, leaving behind contact regions 801, 802 on surface 611 of substrate 61. FIGS. 7-16, illustrate the case where only two down-leads 70 are being provided, wherein region 801 is intended to make contact to first metal layer 68 and region 802 is intended to make contact to second metal layer 69, however this is merely be by way of example and not intended to be limiting. Persons of skill in the art will understand based on the description herein that any number of down-lead contacts may be provided. In step 405 of FIG. 11, first dielectric layer 671 of, for example, silicon nitride and of thickness in the range of usefully, at least about 0.1K Angstrom units, conveniently 0.1K to 8K Angstrom units and preferably 1K to 2K Angstrom units is deposited over contact regions 801, 802 and the remaining portions of surface 611 of substrate 61. In step 406, FIG. 12, the result of applying a further masking layer (not shown) and etching opening 86 over contact region 801 in first dielectric layer 671 is shown. Persons of skill in the art will understand how to perform such routine masking and etching steps. In step 407 of FIG. 13, first metal layer of, for example, plated gold and of thickness in the range of, usefully, at least 1K Angstrom units, conveniently 1K to 120K Angstrom units and preferably 10K to 15K Angstrom units is deposited and patterned to provide lead 868 analogous to leads 701, 702 and 706 of FIG. 6 coupling first metal layer 68 to contact region 801 on substrate 61. Lead 868 is conveniently a part of first conductor layer 68. Only this small portion of first metal layer 68 is shown in FIG. 13. First metal layer 68 extends laterally to such regions as are needed to form the desired integrated passive device. In step 408, FIG. 14, second dielectric layer 672 is provided of, for example, silicon nitride, and of thickness in the range of usefully, at least 0.1K Angstrom units, conveniently 0.1K to 8K Angstrom units and preferably 2K to 3K Angstrom units is deposited, over first metal layer 68 and the remaining portions of first dielectric layer 671, and then patterned in step 409 of FIG. 15 using means well known in the art, to provide opening 89 over second contact region 802. In step 410, FIG. 16, second metal layer 69 is deposited over second dielectric layer 672 so as to fill opening 69 and provide conductor region 869 coupled to contact region 802. Conductor region 869 in combination with contact region 802 corresponds to down-leads 713-715 of device 60 of FIG. 6, that is, those down leads extending from second metal layer 69 to substrate 61. While second metal layer 69 is shown in FIG. 16 as extending everywhere, this is merely for convenience of explanation and persons of skill in the art will understand that the lateral extent and shape of layer 69 is determined by the particular IPD being constructed and that it is appropriately masked and the unwanted regions removed using means well known in the art. The purpose of FIGS. 7-16 is to illustrate how the various down-leads maybe formed coupling first metal layer 68 and/or second metal layer 69 to substrate 61. The lateral definition required to form terminal pads 62, 65, capacitor 63, inductor 65 and/or any other desired components using metal layers 68, 69 and dielectric layers 671, 672 is understood by persons of ordinary skill in the art.

Figure 21:
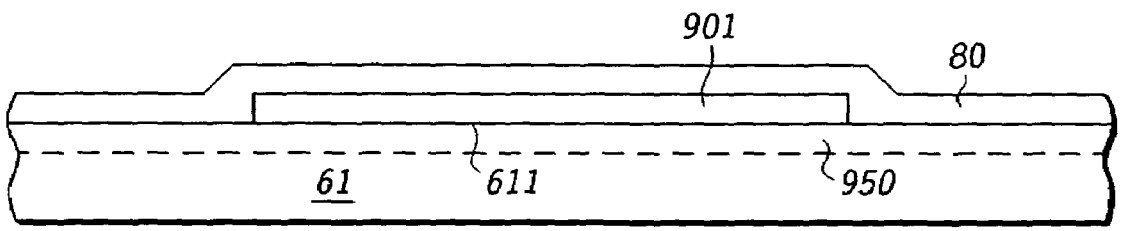
Figure 22:
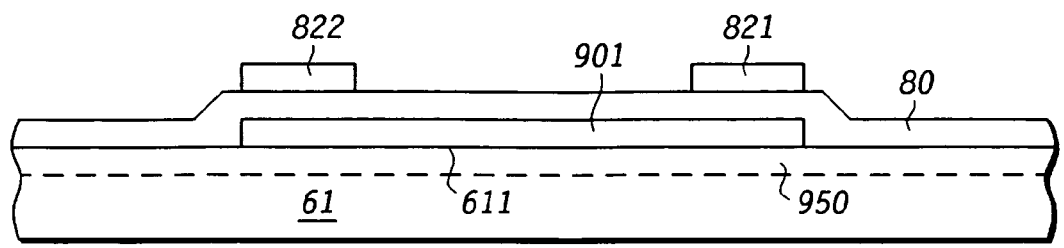
Figure 23:
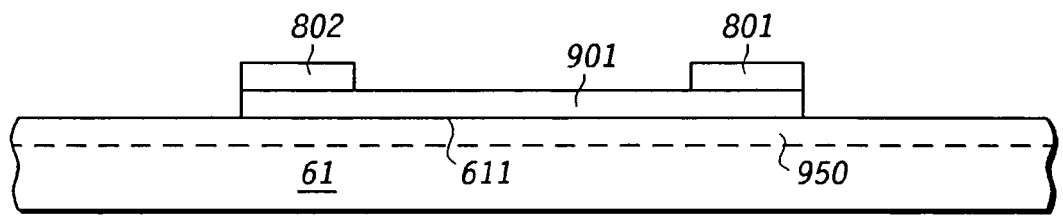
Figure 24:
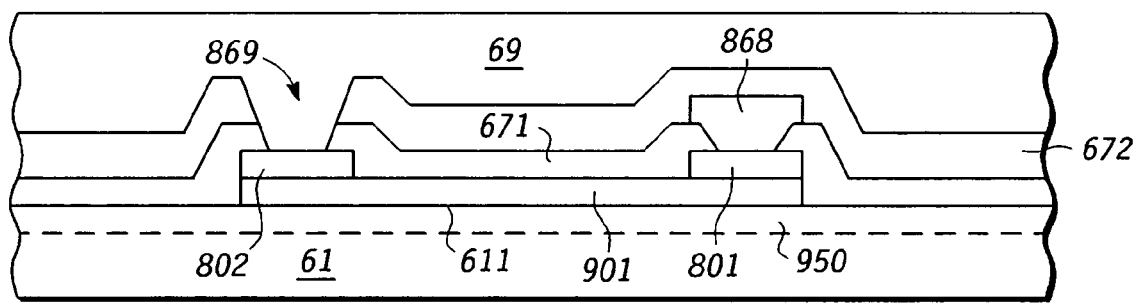
Figure 25:
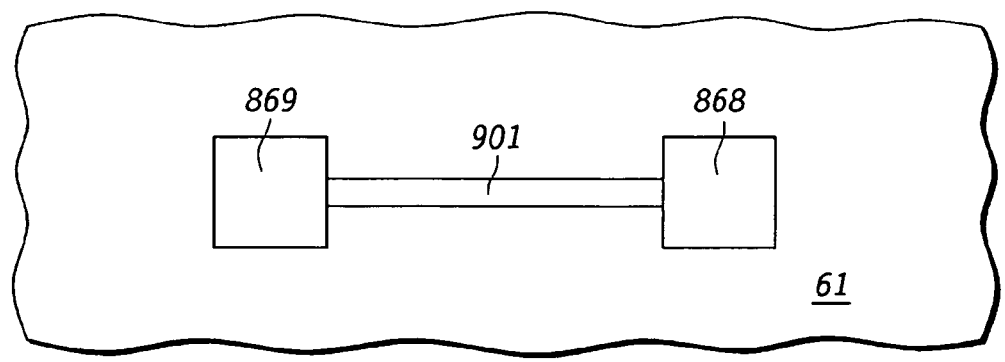
FIG. 25 is a plan view of a portion of the integrated passive device illustrated in FIG. 23.

FIGS. 17-24 are sequential cross-sectional views 401, 401-1, 401-2, 401-2, 402-1, 403-1, 404-1 and 410-1 illustrated steps in a method of fabrication of an integrated passive device analogous to sequence 401-410 of FIGS. 7-16, but according to a yet further embodiment of the present invention. FIG. 25 is a plan view of a portion of the integrated passive device illustrated in FIG. 23. Many of the steps in the method of FIGS. 17-24 are similar to corresponding steps in the method of FIGS. 7-16 and the convention is followed of designating analogous steps in the method of FIGS. 17-24 by adding a suffix, e.g., step 403-1 is analogous to step 403, step 404-1 is analogous to step 404, and so forth. The method of FIGS. 17-25 differ from the method of FIGS. 7-16 in that an underlying high resistivity layer or region (e.g., region 901) is provided on upper surface 611 of substrate 61 for coupling the various down-leads 70 and is therefore suitable for use with insulating substrates as well as semi-insulating substrates. Referring now to FIGS. 17-24, in step 401, FIG. 17, substrate 61 with uppers surface 611 is provided. It is assumed for the purposes of this discussion that substrate 61 is an insulating substrate. In step 401-1, layer 90 of high resistivity material is deposited on surface 611 of substrate 61. High resistivity Si of thickness in the range of usefully at least 10 Angstrom units (needs to be continuous), conveniently 100 to 5K Angstrom units and preferably 200 to 2K Angstrom units is deposited to form layer 90. It is desirable that layer 90 have sheet resistances usefully in the range less than 1E11 Ohms per square, conveniently in the range of 1E6 to 1E11 Ohms per square, and preferably in the range of 1E8 to 1E10 Ohms per square. While such sheet resistance values are useful, what is important is that the resistance of the charge bleed-off connection is at least 1E2 times and more preferably 1E3 to 1E4 times the impedance of the circuit being protected at the frequency range of interest. In step 401-2, FIG. 19, mask region 92 of, for example, photoresist is provided having a lateral extent sufficient to couple the various down-leads 70 that are needed for the integrated passive device being constructed. In step 401-3, FIG. 20, the remainder of layer 90 is etched away so as to provide desired high resistivity region 901 to which the various down-leads 70 can make contact. Steps 402-1, 403-1, and 404-1 of FIGS. 21-23 are analogous to steps 402, 403, 404 of FIGS. 8-10 wherein contact layer 80 is provided, masked by regions 821, 822 and etched to provide down-lead contact regions 801, 802, but which now rest on high resistivity region 902 rather than on surface 611 of substrate 61. The remaining steps follow steps 405-410 of FIGS. 11-16, and result in the structure shown in step 410-1 of FIG. 24. FIG. 25 shows a plan view of region 901 extending between down-leads 868 and 869. Persons of skill in the art will understand that by varying the masking steps, region 901 can be made to extend between any and all desired down-lead connections. Thus, the desired high resistivity coupling of the various elements of IPD 40, 50, 60 can be made even on an insulating substrate. By providing insulating or semi-insulating region 950 on or as a part of substrate 61 (see FIGS. 17-24) beneath layer 92 and region 901, the present invention can be used with highly conductive substrates, since the desired high resistance connections between the various device elements can be provided independent of the resistivity of substrate 61 below region 950. Region 950 can be provided by depositing a layer of insulating material prior to step 401 and/or, depending upon the material chosen for substrate 61, by doping the surface thereof to provide a substantially intrinsic surface layer.

A number of integrated passive device RF couplers employing elements such as are illustrated in FIGS. 1-6, and incorporating the high resistance charge leakage paths described herein, were tested for ESD tolerance and compared with the results of testing an equal number of otherwise substantially identical couplers without such high resistance charge leakage paths. Signals corresponding to five human body model (HBM) positive pulses followed by five HBM negative pulses of increasing voltage were applied and the onset of ESD damage determined. For couplers without the high resistance charge leakage connections of the present invention, the average ESD tolerance was about 525 volts. For couplers incorporating the high resistance charge leakage paths of the present invention described above, the average ESD tolerance was about 950 volts for a structure where the high resistance charge leakage paths were only coupled to the inductor, to about 969 volts for devices that also included such charge leakage paths coupled to the capacitor and terminal connection pads as well as the inductor. Thus, the means and method of the present invention provided a more than a 70% improvement in ESD performance for integrated passive devices without the need for any active devices being added to the circuits. While the present invention is particularly useful in connection with passive devices and has been described herein by way of example for that situation, it is also applicable to circuits containing active devices. For example, the high resistance charge leakage paths described herein can be applied to the terminals of an integrated circuit or a transistor or a group of transistors or bonding pads or other terminals coupled to active devices with beneficial results.

While various materials have been described for contact layer 80, first dielectric layer 671, first metal layer 68, second dielectric layer 672 and second metal layer 69, these are merely by way of example and not intended to be limiting. For example, the term "metal" as used herein is intended to include any form of sufficiently conductive material and not be limited merely to simple metals and metal alloys. Non-limiting examples of further useful materials are provided below:

Substrate: _InP, SiC, GaN, GaAs, Si, Glass, ceramic, plastic, plastic laminate:

First dielectric layer: silicon nitride, silicon oxide, organic materials, glasses and other dielectrics:

First metal layer: Au, Ti, Pt, Cu, and mixtures and alloys thereof, TiW, TN, TiWN, WSi, and various other intermetallics and combinations thereof:

Second dielectric layer: silicon nitride, silicon oxide, organic materials, glasses and other dielectrics:

Second metal layer: Au, Ti, Pt, Cu, and mixtures and alloys thereof, TiW, TN, TiWN, WSi, and various other intermetallics and combinations thereof.

Such materials may be applied by various well known techniques such as, for example, and not intended to be limiting, CVD, PECVD, sputtering, evaporations, screen printing, plating and so forth.

According to a first embodiment, there is provided an integrated apparatus with ESD protection, comprising, one or more passive elements having portions potentially exposed to ESD transients, and one or more charge leakage resistances extending between the portions potentially exposed to ESD transients, wherein the resistances have values much larger than the impedance of the one or more passive elements at their normal operating frequency. According to a further embodiment, the one or more passive elements are formed on a semi-insulating substrate, and wherein the apparatus further comprises electrical leads coupling the portions potentially exposed to ESD transients to spaced-apart contacts on the semi-insulating substrate, such that the charge leakage resistances are formed by the substrate resistance between the spaced-apart contacts. According to a still further embodiment, the one or more passive elements are formed on an insulating substrate, and the apparatus further comprises, a high resistivity layer formed on the substrate beneath the one or more passive elements, and electrical leads coupling the portions potentially exposed to ESD transients to spaced-apart contacts on the high resistivity layer such that the charge leakage resistances are formed by the layer resistance between the spaced-apart contacts. According to a yet further embodiment, the one or more passive elements are formed over a conductive substrate, and the apparatus further comprises, an insulating layer on the substrate electrically isolating the elements from the substrate, a high resistivity layer formed on the insulating layer beneath the one or more passive elements, and electrical leads coupling the portions potentially exposed to ESD transients to spaced-apart contacts on the high resistivity layer such that the charge leakage resistances are formed by the layer resistance between the spaced-apart contacts. According to a yet still further embodiment, the charge leakage resistances are at least about 100 times larger than the impedance of the apparatus at its normal operating frequency of interest. According to a still yet further embodiment, the apparatus further comprises an active device having at least one terminal coupled to the one or more charge leakage resistances. According to another embodiment, the charge leakage resistances are at least about 500 times larger than the impedance of the apparatus at its normal operating frequency of interest. According to a yet another embodiment, the charge leakage resistances are at least about 1000 times larger than the impedance of the apparatus at its normal operating frequency of interest.

According to a second embodiment, there is provided an ESD protected integrated electronic apparatus, comprising, an inductor, a capacitor coupled to the inductor, two terminals coupled to the inductor and the capacitor, and one or more charge leakage resistances coupled between the two terminals. According to a further embodiment, the one or more charge leakage resistances have values at least about 100 times larger than the impedance of the apparatus as measured between the two terminals at its normal operating frequency. According to a still further embodiment, the one or more charge leakage resistances have values at least about 1000 times larger than the impedance of the apparatus as measured between the two terminals at its normal operating frequency. According to a yet further embodiment, at least one of the one or more charge leakage resistances is coupled to the inductor. According to a yet still further embodiment, at least one of the one or more charge leakage resistances is coupled to the capacitor. According to a still yet further embodiment, at least one of the one or more charge leakage resistances is coupled between the two terminals.

According to a third embodiment, there is provided a method for forming an ESD protected electronic apparatus, comprising, providing a substrate, forming at least two spaced-apart electrical contacts on the substrate, forming electric conductors extending from the at least two spaced-apart electrical contacts, and forming at least one passive element having portions in contact with the electric conductors. According to a further embodiment, the providing step comprises providing a substrate comprising a III-V material. According to a still further embodiment, the III-V material comprises GaAs. According to a yet further embodiment, the step of forming the at least two spaced-apart electrical contacts on the substrate comprises, forming an electrically insulating layer on or in an upper surface the substrate, forming a high resistivity layer on the insulating layer, and forming the at least two spaced-apart contacts on the high resistivity layer. According to a yet still further embodiment, the step of forming electrical conductors extending from the at least two spaced-apart electrical contacts comprises, providing an electrically insulating layer over the at least two spaced-apart electrical contacts, patterning the electrically insulating layer to expose at least a first of the at least two spaced-apart electrical contacts, and applying a first metal layer over the first electrically insulating layer to form one of the electric conductors in contact with the first of the at least two spaced-apart electrical contacts. According to a still yet further embodiment, the step of forming electrical conductors extending from the at least two spaced-apart electrical contacts further comprises, after the step of applying the first metal layer, applying a second electrically insulating layer over at least a portion the first metal layer, patterning the first and second electrical insulating layers to expose a second of the at least two spaced-apart electrical contacts, and applying a second metal layer over the second electrically insulating layer to form a second electric conductor in contact with the second of the at least two spaced-apart electrical contacts.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated apparatus with ESD protection, comprising:
   one or more passive elements having portions potentially exposed to ESD transients; and
   one or more charge leakage resistances extending between the portions potentially exposed to ESD transients, wherein the resistances have values much larger than the impedance of the one or more passive elements at their normal operating frequency.

2. The apparatus of claim 1, wherein the one or more passive elements are formed on a semi-insulating substrate, and wherein the apparatus further comprises electrical leads coupling the portions potentially exposed to ESD transients to spaced-apart contacts on the semi-insulating substrate, such that the charge leakage resistances are formed by the substrate resistance between the spaced-apart contacts.

3. The apparatus of claim 1, wherein the one or more passive elements are formed on an insulating substrate, and wherein the apparatus further comprises:
   a high resistivity layer formed on the substrate beneath the one or more passive elements; and
   electrical leads coupling the portions potentially exposed to ESD transients to spaced-apart contacts on the high resistivity layer such that the charge leakage resistances are formed by the layer resistance between the spaced-apart contacts.

4. The apparatus of claim 1, wherein the one or more passive elements are formed over a conductive substrate, and wherein the apparatus further comprises:
   an insulating layer on the substrate electrically isolating the elements from the substrate;
   a high resistivity layer formed on the insulating layer beneath the one or more passive elements; and
   electrical leads coupling the portions potentially exposed to ESD transients to spaced-apart contacts on the high resistivity layer such that the charge leakage resistances are formed by the layer resistance between the spaced-apart contacts.

5. The apparatus of claim 1, wherein the charge leakage resistances are at least about 100 times larger than the impedance of the apparatus at its normal operating frequency of interest.

6. The apparatus of claim 5, further comprising an active device having at least one terminal coupled to the one or more charge leakage resistances.

7. The apparatus of claim 1, wherein the charge leakage resistances are at least about 500 times larger than the impedance of the apparatus at its normal operating frequency of interest.

8. The apparatus of claim 1, wherein the charge leakage resistances are at least about 1000 times larger than the impedance of the apparatus at its normal operating frequency of interest.

9. An ESD protected integrated electronic apparatus, comprising:
   an inductor;
   a capacitor coupled to the inductor;
   two terminals coupled to the inductor and the capacitor; and
   one or more charge leakage resistances coupled between the two terminals and having values at least about 100 times larger than the impedance of the apparatus as measured between the two terminals at its normal operating frequency.

10. The apparatus of claim 9 wherein the one or more charge leakage resistances have values at least about 1000 times larger than the impedance of the apparatus as measured between the two terminals at its normal operating frequency.

11. The apparatus of claim 9 wherein at least one of the one or more charge leakage resistances is coupled to the inductor.

12. The apparatus of claim 9 wherein at least one of the one or more charge leakage resistances is coupled to the capacitor.

13. The apparatus of claim 9 wherein at least one of the one or more charge leakage resistances is coupled between the two terminals.

* * * * *